United States Patent
Bauer et al.

(10) Patent No.: US 11,372,334 B2
(45) Date of Patent: Jun. 28, 2022

(54) METHOD FOR PRODUCING A REFLECTIVE OPTICAL ELEMENT, REFLECTIVE OPTICAL ELEMENT, AND USE OF A REFLECTIVE OPTICAL ELEMENT

(71) Applicant: Carl Zeiss SMT GmbH, Oberkochen (DE)

(72) Inventors: Markus Bauer, Oberkochen (DE); Ulrich Bingel, Michelfeld (DE); Willi Anderl, Huettlingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 478 days.

(21) Appl. No.: 16/686,600

(22) Filed: Nov. 18, 2019

(65) Prior Publication Data

US 2020/0096874 A1    Mar. 26, 2020

Related U.S. Application Data

(60) Division of application No. 15/650,141, filed on Jul. 14, 2017, now Pat. No. 10,534,269, which is a
(Continued)

(30) Foreign Application Priority Data

Jan. 22, 2015    (DE) .......................... 102015100918.8

(51) Int. Cl.
*G02B 7/182* (2021.01)
*G03F 7/20* (2006.01)
(Continued)

(52) U.S. Cl.
CPC ........... *G03F 7/70266* (2013.01); *C25D 7/08* (2013.01); *G02B 5/0891* (2013.01);
(Continued)

(58) Field of Classification Search
CPC ..... G03F 7/70266; C25D 7/08; G02B 5/0891; G02B 5/1847; G02B 7/1815; G21K 1/067; G21K 2201/065
(Continued)

(56) References Cited

U.S. PATENT DOCUMENTS 4,427,497 A    1/1984 Heinz
6,792,016 B2   9/2004 Kugler
(Continued)

FOREIGN PATENT DOCUMENTS

CN    1963568 A    5/2007
DE    100 52 249 A1    4/2002
(Continued)

OTHER PUBLICATIONS

Frank M. Anthony, "High heat load optics: an historical overview," 2417 Optical engineering 34(1995) February, No, 2, Bellingham, WA, US, p. 313-320.
(Continued)

*Primary Examiner* — Euncha P Cherry
(74) *Attorney, Agent, or Firm* — Fish & Richardson P.C.

(57) ABSTRACT

The disclosure provides a method that includes filling a cavity in a substrate with a second material, wherein the substrate includes a first material. The method also includes using galvanic and/or chemical deposition of a third material to apply an overcoating to a first surface of the substrate in a region of the cavity. The method further includes removing the second material from the cavity. In addition, the method includes, before or after removing the second material from the cavity, applying a reflective layer to the overcoating. The disclosure also provides related optical articles and systems.

20 Claims, 7 Drawing Sheets

Related U.S. Application Data continuation of application No. PCT/EP2016/050856, filed on Jan. 18, 2016.

(51) Int. Cl.
  *G02B 7/18*    (2021.01)
  *G02B 5/08*    (2006.01)
  *G21K 1/06*    (2006.01)
  *C25D 7/08*    (2006.01)
  *G02B 5/18*    (2006.01)

(52) U.S. Cl.
  CPC ......... *G02B 5/1847* (2013.01); *G02B 7/1815* (2013.01); *G21K 1/067* (2013.01); *G21K 2201/065* (2013.01)

(58) Field of Classification Search
  USPC ........................................................ 359/845
  See application file for complete search history.

(56) References Cited

U.S. PATENT DOCUMENTS

| | | | |
|---|---|---|---|
| 8,342,701 | B2 | 1/2013 | Kierey et al. |
| 8,723,147 | B2 | 5/2014 | Abhari et al. |
| 2006/0227826 | A1 | 10/2006 | Balogh et al. |
| 2007/0091485 | A1 | 4/2007 | Phillips et al. |
| 2010/0182710 | A1 | 7/2010 | Dinger et al. |
| 2011/0051267 | A1* | 3/2011 | Kierey ................... G02B 7/181 359/845 |
| 2013/0176614 | A1 | 7/2013 | Anderl et al. |
| 2014/0145219 | A1 | 5/2014 | Cornelissen et al. |
| 2017/0315453 | A1 | 7/2017 | Bauer et al. |

FOREIGN PATENT DOCUMENTS

| | | |
|---|---|---|
| DE | 10052249 A1 | 4/2002 |
| DE | 10 2005 053 415 A1 | 5/2007 |
| DE | 10 2009 032 194 A1 | 4/2010 |
| DE | 10 2009 039 400 A1 | 3/2011 |
| DE | 10 2010 034 476 A1 | 2/2012 |
| EP | 1376185 A2 | 1/2004 |
| JP | 08-211211 A | 8/1996 |
| JP | 2005004145 | 1/2005 |
| JP | 2010-159470 A | 7/2010 |
| JP | 2011053687 | 3/2011 |
| JP | 2012099791 | 5/2012 |
| JP | 2012523106 | 9/2012 |
| JP | 52-59032 B2 | 8/2013 |
| WO | WO 2007/051638 A1 | 5/2007 |
| WO | WO 2008/145364 A2 | 12/2008 |
| WO | WO 2012/046133 | 4/2012 |

OTHER PUBLICATIONS

Translation of International Search Report for corresponding Appl No. PCT/EP2016/050856, dated Apr. 1, 2016.
Translation of International Report on Patentability for corresponding Appl No. PCT/EP2016/050856, dated Aug. 3, 2017.
Japanese Office Action, with English summary, for corresponding JP Appl No. 2017-538708, dated Nov. 5, 2019.
Japanese Office Action, with English summary, for corresponding JP Appl No. 2020-048144, dated Jan. 20, 2021.
Japanese Office Action, with English summary, for corresponding JP Appl No. 2020-048144, dated Nov. 15, 2021.

* cited by examiner

METHOD FOR PRODUCING A REFLECTIVE OPTICAL ELEMENT, REFLECTIVE OPTICAL ELEMENT, AND USE OF A REFLECTIVE OPTICAL ELEMENT

CROSS-REFERENCE TO RELATED APPLICATIONS

The present application is a division of, and claims benefit under 35 USC 120 to, U.S. application Ser. No. 15/650,141, filed Jul. 14, 2017, which is a continuation of, and claims benefit under 35 USC 120 to, international application PCT/EP2016/050856, filed Jan. 18, 2016, which claims benefit under 35 USC 119 of German Application No. 10 2015 100 918.8, filed Jan. 22, 2015. The entire disclosure of these applications are incorporated by reference herein.

FIELD

The disclosure relates to a method for producing a reflective optical element which has an optically effective surface for interacting with light and at least one cavity for receiving a fluid. The disclosure furthermore relates to such a reflective optical element. In addition, the disclosure relates to the systems including such reflective optical elements and uses of such reflective optical elements.

BACKGROUND

Reflective optical elements, which are used in optical systems that operate with high light intensities and/or with light in the very short-wave spectral range such as the VUV or EUV spectral range, are exposed to high thermal loads during operation. Examples are reflective optical elements which are used in optical systems for material processing with laser light with a very high laser power, for example for cutting, drilling, welding, soldering or fusing. Further examples are reflective optical elements which are used in optical systems that are used in the very short-wave spectral range, in particular in the EUV or even in the X-ray region. A specific example is a collector mirror which is used in the EUV light source of a microlithographic projection exposure apparatus.

On account of the high thermal load, which can impair the optical properties of such reflective optical elements or can shorten the lifetime of such reflective optical elements, it is desirable to actively cool these reflective optical elements, for example with a gaseous or liquid fluid, for example water. To this end, at least one cavity, usually in the form of one or more channels, is formed in the reflective optical element in question, the fluid flowing through the channels in order to carry heat away from the optical element. In the reflective optical element according to the disclosure, however, the at least one cavity is not limited to the purpose of conducting a cooling medium.

Numerous production methods have been proposed, with which reflective optical elements can be produced with at least one cavity integrated in the optical element. DE 10 2005 053 415 A1 describes a method for producing individual mirror shells of a collector for EUV applications. In the method, first of all the optical layer, having the optically effective surface, of a mirror shell is galvanicly applied to a core, and subsequently a substrate is galvanicly applied to this layer, until the substrate has a desired thickness. After the core has been removed, a cavity is worked into the substrate from that surface of the substrate that faces away from the optical layer. The cavity is then filled with an electrically conductive material, and this is followed by a top layer being applied to the free surface of the substrate. The filling material, which was previously introduced into the channel(s), is subsequently removed again for example via solvents or by heating.

A potential disadvantage with such a production method is that the subsequent introduction of the at least one cavity into the substrate, i.e. after the substrate has been applied to the optically effective layer, can impair the optical properties of the optical layer. For example, the optical layer can be undesirably deformed in the process.

In some known production methods, it is proposed to apply prefabricated cooling lines in the form of tubes to the rear side of the optical layer of the mirror shell, for example by soldering, application by electroplating or the like. Such methods can be comparatively complicated.

Some conventional methods for introducing at least one cavity into a reflective optical element consist in producing the reflective optical element from two shells, i.e. from a base and a top, which are connected together by soldering or adhesive bonding or the like, as described in DE 10 2010 034 476 A1 or U.S. Pat. No. 6,792,016 B2. The at least one cavity was introduced into one of the two shells. In large-area optical elements, there can be a risk of at least partial detachment of the two shells from one another during operation especially when the fluid in the at least one cavity is under pressure and the optical element is operated under vacuum.

US 2006/0227826 A1 proposes introducing cooling channels into the substrate of the reflective optical element as radially directed bores after the optical element has been manufactured.

Known methods for producing a reflective optical element with at least one cavity for receiving a fluid can have the drawback that they are complicated and are not always compatible with the desired properties for high-precision optically effective surfaces, be these spheres, aspheres, free forms, or involve the use of materials which can be machined only with complicated methods and expensive tools.

SUMMARY

The disclosure seeks to provide a method for producing a reflective optical element of the type mentioned at the beginning, which at least partially avoids the abovementioned drawbacks, is in particular less complicated and is readily combinable with surfaces of any desired shape, in particular aspheric or free-form surfaces, as optically effective surfaces.

According to a first aspect, the disclosure provides a method for producing a reflective optical element which has an optically effective surface for interacting with light and at least one cavity for receiving a fluid, having the steps of: a) providing a substrate made of a first material, b) introducing the at least one cavity into the substrate from a first surface of the substrate, c) filling the at least one cavity with a second material, d) applying an overcoating to the first surface, even in the region of the at least one cavity, by galvanic and/or chemical deposition of at least one layer made of at least one third material, e) emptying the second material out of the at least one cavity, f) applying at least one reflective layer to the overcoating, wherein step f) is carried out before step e) or after step e).

Thus, in the production method according to this aspect, the at least one cavity is introduced into the substrate, for example by machining the substrate, and only then is the optical construction of the reflective optical element continued. The optical construction of the reflective optical element includes at least the overcoating of the substrate on the side on which the at least one cavity was introduced into the substrate, and the application of the at least one reflective layer to the overcoating. Compared with the method known from DE 10 2005 053 415 A1, this results in the advantage that the optical construction made up of the overcoating and the at least one reflective layer is not negatively affected by the introduction of the at least one cavity into the substrate, since the cavity has already been made. The emptying of the second material out of the at least one cavity, which can take place before or after the application of the at least one reflective layer to the overcoating, does not impair the optical construction of the optical element.

Furthermore, in this method according to the disclosure, the reflective optical element is also not produced constructed from two shells, as proposed in some cases in the prior art, which are subsequently joined together by adhesive bonding, soldering or the like, but rather, on the substrate, after the introduction of the at least one cavity, an overcoating is constructed on the substrate, the overcoating extending at least also over the at least one cavity. The overcoating in this case takes place by galvanic deposition and/or chemical deposition of one or more layers. The composite made up of the overcoating and substrate is much more resistant to undesired detachment than when two shells are connected together by adhesive bonding, soldering or the like, as in the prior art. The overcoating by electrochemical and/or chemical deposition is in particular readily combinable with aspheric or free-form optical surfaces, since it is possible to use materials that can be very finely machined, for example copper, for the overcoating. The overcoating is also readily combinable with large mirror optics, in which manufacturing by adhesively bonding or soldering on a separate cover is difficult or disproportionately complicated. By contrast, overcoating by galvanic and/or chemical deposition can be carried out easily in a comparatively short time in a process that is easy to manage. Overcoating of the substrate by galvanic or chemical deposition furthermore has the advantage that the overcoating can be applied in a tension-free manner as a rule.

With the production method according to the disclosure, the at least one cavity can be realized in the reflective optical element particularly close to the optically effective surface of the element, depending on the thickness of the overcoating, and, in particular, cavities in the form of channels with very small transverse dimensions of less than 1 mm can be realized particularly easily.

In the case of galvanic overcoating, it is advantageous for the material of the substrate to be electrically conductive, such that it is possible to refrain from providing an electrically conductive coating of the substrate prior to the galvanic overcoating. In the case of chemical deposition, it is possible for the material of the substrate also not to be electrically conductive, and an electrically conductive layer prior to the application of the overcoating is likewise not required.

In a preferred configuration of the method, step a) furthermore has the step of: preforming the first surface of the substrate to form a surface shape which corresponds to the basic shape of the optically effective surface.

In this procedure, the substrate is roughly preformed in that the basic shape of the optical surface of the reflective optical element is worked into the first surface of the substrate, for example in a concave, convex or similar manner. This basic shape is substantially retained during the subsequent overcoating of the substrate, such that the surface of the overcoating only subsequently has to be finely formed or fine machined, for example aspherized or formed into a free form, in order to produce the precise fine form of the optically effective surface, which is not changed by the application of the reflective layer.

In a further preferred configuration, the second material is a material that is able to be liquefied by application of heat and/or a material that is soluble in a solvent.

The second material with which the at least one cavity is filled prior to overcoating, can, in this configuration, be liquefied particularly easily by heating and/or by dissolving the material in a solvent, and can then be removed from the at least one cavity, for example by letting it run out or by sucking or flushing it out.

Preferably, the second material is electrically conductive.

In particular in conjunction with an electrically conductive substrate, this measure has the advantage that, in the case of galvanic overcoating of the substrate, no previous electrically conductive coating has to be applied in the region of the at least one cavity.

Preferred examples of the second material are wax, polymers or salts. These can also be made conductive by admixture of electrically conductive substances, for example graphite, metal particles or the like.

When the substrate and/or the second material for filling the at least one cavity is or are not electrically conductive, it is preferred if, after step c) and before step d), an electrically conductive layer is applied to the first surface of the substrate, if overcoating is intended to take place by galvanic deposition. In this case, the additional electrically conductive layer can be very thin.

In a further preferred configuration of the method, following step d) or e), the surface of the overcoating is fine-machined, in particular subtractively fine-machined, in accordance with the fine form of the optically effective surface that is to be achieved.

Fine machining should be understood here in particular as meaning the fine forming of the surface of the overcoating, which corresponds as precisely as possible to the desired fine form of the optically reflective surface of the optical element to be produced. The material or materials of the overcoating are preferably selected such that they allow subtractive fine machining, in particular ultraprecise machining without greater effort and without increased tool wear. Materials for galvanic overcoating, which are particularly advantageous for subtractive fine machining, are copper and (galvanic) nickel, and in the case of chemical overcoating, in particular nickel with phosphorus (NiP) (chemical nickel).

During fine machining, or fine forming, it is also possible for an optically effective structure, for example a diffraction grating, or an aspherization or free-form surface, to be worked into the overcoating, specifically in a comparatively easy process.

Further preferably, the surface, fine-machined in this way, of the overcoating is subsequently smoothed, in particular polished.

Furthermore, as provided in a further preferred configuration, the shape of the fine-machined surface of the overcoating can subsequently be corrected, in particular via ion beam forming.

In a further preferred configuration of the method, the at least one cavity is subjected to pressure while the surface of the overcoating is being fine-machined.

The pressure can be a positive pressure (overpressure) or a negative pressure (underpressure).

As a result of this measure, surface deformations of the optically effective surface that arise during the subsequent operation thereof are already taken into consideration in the production of the reflective optical element. Such surface deformations that arise during operation of the reflective optical element can be brought about by the fluid passed through the at least one cavity under pressure, in particular when the reflective optical element is operated under vacuum. At the points at which for example bulging of the optically effective surface foreseeably occurs during operation (usually in the region of the at least one cavity), the surface of the overcoating can be removed by the present measure to such an extent that the bulging that arises during operation of the optical element can be compensated for thereby. Conversely, when indentation of the optically effective surface foreseeably occurs during operation, it is possible so to speak to also simulate this subsequent operating state with an underpressure in the cavity during fine machining and take it into consideration during fine machining. In other words, the operating state that occurs during operation of the element is provided by the present measure during the fine machining of the surface of the overcoating.

In a further preferred configuration of the method, step b) is carried out via milling, turning, drilling, erosion and/or laser ablation.

These techniques for introducing the at least one cavity into the substrate are distinguished by their easy ability to be carried out and ready manageability.

Furthermore, in a preferred configuration, provision is made for step d) to be carried out such that a uniform or nonuniform thickness of the overcoating is produced in a manner distributed over the first surface of the substrate.

In the case of galvanic overcoating, this can be realized by positioning and spacing apart the electrodes relative to one another in a corresponding manner. With a varying thickness of the overcoating, a previously selected long-wave surface deformation can additionally be advantageously manipulated and set by variation in the pressure in the at least one cavity.

Furthermore, in the method, provision is preferably made for the third material to be varied continuously or incrementally during overcoating.

In this way, it is possible for example, during overcoating with an alloy in an galvanic process, for the composition of the alloy to be changed continuously or incrementally during overcoating. Thus, it is possible for example for at least the topmost layer of the overcoating to consist of a material which can be machined particularly readily.

According to a further aspect, the disclosure provides a reflective optical element, having a substrate, an overcoating made of at least one galvanicly or chemically deposited layer on a first surface of the substrate, at least one cavity for receiving a fluid, wherein the at least one cavity is arranged next to the first surface, wherein the overcoating also extends over the at least one cavity, and wherein the at least one cavity is free of material of the overcoating, and having at least one reflective layer on that surface of the overcoating that faces away from the substrate, wherein the at least one reflective layer has an optically effective surface.

Compared with the reflective optical elements known from the prior art, a reflective optical element according to the disclosure can be produced with less effort, in particular with surfaces formed in any desired manner, in particular aspheric or free-form surfaces. As a result of the arrangement of the at least one cavity, preferably a plurality of channels for a fluid, close to the surface, the reflective optical element can not only be cooled particularly effectively, but can also be used particularly readily as a manipulator or compensator in an optical system, in that the channels are subjected to pressure, to be understood also as a negative pressure or underpressure, with the result that the surface shape of the optically effective surface can be changed in a targeted manner. Since the at least one cavity is free of material of the overcoating, the cavity or cavities can be realized with very small dimensions, without the risk of the cavity or the cavities becoming clogged with material of the overcoating or of the cavity volume being reduced. Therefore, it is also not necessary for a greater volume of the cavity or cavities to be provided during production.

Preferably, the reflective optical element according to the disclosure is produced by a production method according to the disclosure as per one or more of the abovementioned configurations.

Preferably, the at least one cavity is configured in the form of one or more channels. In particular when the reflective optical element is used as a manipulator/compensator, a plurality of channels, through which a fluid, for example a gas or a liquid, is passed, are suitable, wherein the pressure of the fluid in the individual channels can preferably be controlled independently of one another from channel to channel.

Preferably, the channels have a width which is in the range from a few micrometers to around one millimeter or more.

Such miniaturized channels for the passage of a fluid are made possible in particular in that the channels are introduced into the substrate from one of the surfaces thereof before overcoating with the galvanic layer.

Further preferably, the at least one cavity has at least one opening which leads into the optically effective surface of the reflective layer.

In this configuration, the fluid passing through the at least one cavity can be used to flush the optically effective surface of the reflective layer of the optical element.

In a further preferred configuration, the substrate includes steel, in particular austenitic or martensitic steel, a copper alloy and/or aluminum-silicon, in particular with a silicon content of up to 35%.

The abovementioned materials are highly suitable materials for the substrate, since they are easy to machine, in particular in order to introduce the at least one cavity and to rough-form the basic shape of the optically effective surface. The abovementioned materials can be machined particularly readily without the cutting tool being subjected to increased wear in the process, compared with other materials.

The overcoating preferably includes copper, nickel and/or nickel with phosphorus (NiP).

These materials, too, are particularly readily suitable for the overcoating with regard to their easy machinability, since they allow highly precise fine machining of the surface of the overcoating. In particular, these materials are likewise machinable in a tool-preserving manner.

Preferably, the materials of the substrate and of the overcoating are selected such that they have an at least approximately identical coefficient of thermal expansion, preferably with a difference between the coefficients of thermal expansion of less than 10 ppm/K, more preferably less than 5 ppm/K, more preferably less than 2 ppm/K.

Advantageously, by way of this measure, thermal loads on the reflective optical element during operation do not result, or at least result only a little, in impairments to the optical quality of the optical element on account of different expansion behaviors of the substrate and overcoating.

Particularly preferred combinations of materials for the substrate and for the overcoating are: aluminum-silicon, austenitic steel or copper alloy for the substrate, and copper for the overcoating. A further particularly preferred combination of materials for the substrate and the overcoating is martensitic steel for the substrate and nickel for the overcoating.

The at least one reflective layer can be a coating made of molybdenum and silicon layers. Further preferably, the material(s) of the overcoating has/have a coefficient of thermal expansion which is greater than a coefficient of thermal expansion of the material(s) of the substrate.

As a result, it is possible to put the overcoating under tensile stress on the substrate when it is applied to the substrate.

Further preferably, the overcoating has a uniform thickness, or the overcoating has a thickness that varies over the first surface of the substrate, as already described above in connection with the production method.

According to a further aspect, a reflective optical element according to one or more of the abovementioned configurations is used according to the disclosure as a mirror in an optical system for applications in the VUV, EUV or even shorter-wave spectral range or for material processing with high-intensity light.

According to a further aspect, a reflective optical element according to one or more of the abovementioned configurations is used as a collector mirror in an optical system, in particular for EUV microlithography.

According to yet a further aspect of the present disclosure, a reflective optical element according to one or more of the abovementioned configurations is used as an optical compensator and/or manipulator, wherein the at least one cavity is subjected to variable pressure in order to compensate for an undesired deformation of the optically effective surface, or in order to produce a desired deformation in the optically effective surface. The reflective optical element can thus be used for wavefront manipulation, in order for example to compensate for optical aberrations of the optical system or generally to deliberately change the wavefront.

In the abovementioned uses, the reflective optical element can be a macroscopic large-area mirror or a mirror element of a one- or two-dimensional mirror array. Use as a light-mixing element with a honeycomb or cylinder honeycomb shape is also possible. Finally, the reflective optical element can be configured as a thin membrane, optionally with a sensor system and/or actuator system attached to the rear, and be used as a wavefront manipulator.

BRIEF DESCRIPTION OF THE DRAWINGS

Further advantages and features can be gathered from the following description and the attached drawings. It goes without saying that the abovementioned features and those yet to be explained below may be used not only in the respectively specified combination but also in other combinations or on their own, without departing from the scope of the present disclosure. Exemplary embodiments of the disclosure are illustrated in the drawing and described in more detail below with reference thereto. In the drawings.

DESCRIPTION OF EXEMPLARY EMBODIMENTS

Figure 1:
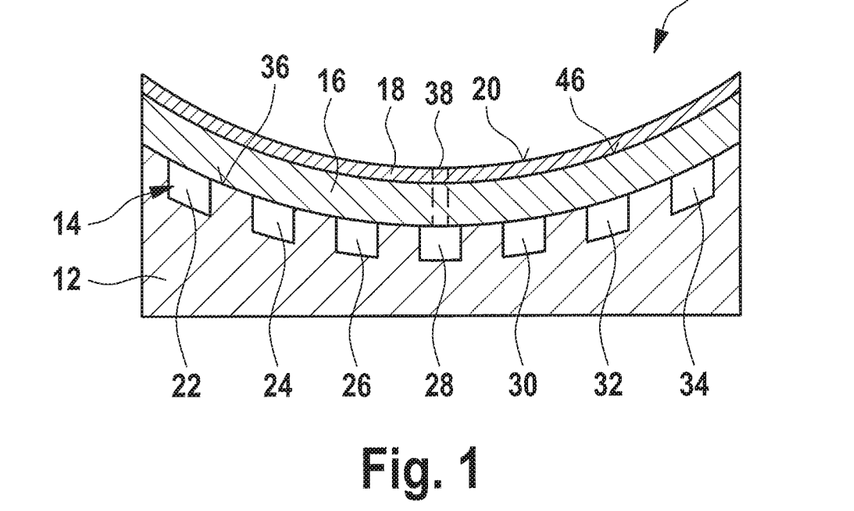
FIG. 1 shows a sectional illustration of a reflective optical element.

FIG. 1 shows a reflective optical element, provided with the general reference sign 10, in section. The reflective optical element 10 can be used in different optical systems and for various purposes, as will be explained in more detail below.

The reflective optical element 10 generally has a substrate 12, at least one cavity 14, an overcoating 16 and a reflective layer 18, wherein the latter has an optically effective surface 20 on which light or generally electromagnetic radiation, which is reflected by the optically effective surface 20, impinges during operation of the reflective optical element 10.

The at least one cavity 14 serves to receive a fluid, wherein such a fluid can be a cooling medium, a flushing medium and/or a medium for subjecting the at least one cavity 14 to pressure, which should also be understood to be an underpressure, wherein the latter medium is useful for use of the element 10 as a manipulator/compensator. It goes without saying that all three functions mentioned (cooling, flushing, manipulation/compensation) can be realized by one and the same fluid.

In the exemplary embodiment shown, the cavity 14 has a plurality of cavities in the form of channels 22, 24, 26, 28, 30, 32, 34, wherein these channels 22 to 34 can be separated from one another in a fluid-tight manner, or at least some of the channels or all of the channels can communicate with one another.

The at least one cavity 14 is arranged adjacent to a first surface 36 of the substrate 12, the surface 36 facing the optically effective surface 20. The overcoating 16 extends here over the at least one cavity 14, in this case the channels 22 to 34.

The overcoating 16 in this case closes off the channels 22 to 34 in a fluid-tight manner at the surface 36 of the substrate 12. In an alternative exemplary embodiment, however, the at least one cavity 14 can have at least one opening 38, as is shown for example by way of broken lines for the channel 28. In this case, the optically effective surface 20 can be flushed via the fluid circulating through the at least one cavity 14.

In FIG. 1, the thicknesses of the substrate 12, of the overcoating 16 and of the reflective layer 18 and the dimensions of the channels 22 to 34 are not illustrated true to scale. The channels 22 to 34 can have a width and/or depth of less than 1 mm, for example a few 10 µm.

The overcoating 16 can be several millimeters thick.

The overcoating 16 has at least one layer galvanically or chemically deposited on the first surface 36. The overcoating 16 can be constructed from a single layer or from several layers.

The overcoating 16 can have been applied directly to the first surface 36 of the substrate 12, or indirectly by an intermediate layer (not shown) having been applied between the overcoating 16 and the substrate 12.

For the substrate 12, the following materials are particularly suitable: aluminum-silicon with a silicon content of up to 35% (trade name Dispal®), austenitic or martensitic steel, in particular 1.4 steel, or a copper alloy, for example a copper alloy which is sold under the trade name GlidCop® or Elmedur®.

The overcoating 16 can be formed particularly from the following materials: copper, (galvanic) nickel in the case of the overcoating 16 being in the form of an galvanic overcoating, and/or nickel with phosphorus (NiP) (chemical nickel) in the case of the overcoating 16 being configured as a chemically deposited overcoating.

The material(s) of the substrate 12 and the material(s) of the overcoating 16 are in this case selected such that they have an at least approximately identical coefficient of thermal expansion, such that tensions do not arise between the substrate 12 and overcoating 16 when the reflective optical element 10 heats up, for example on account of light impingement.

The coefficients of thermal expansion of the material(s) of the substrate 12 differ from the coefficients of thermal expansion of the material(s) of the overcoating 16 preferably by less than 10 ppm/K, more preferably less than 5 ppm/K, more preferably less than 2 ppm/K.

The material(s) of the overcoating 16 can in this case have a coefficient of thermal expansion which is slightly greater than the coefficient of thermal expansion of the material(s) of the substrate 12.

In the exemplary embodiment shown, the overcoating 16 has a uniform thickness over the substrate 12, wherein, however, some other configuration, in which the overcoating 16 does not have a uniform thickness but a varying thickness over the substrate 12, can also be drawn into consideration, as is shown by way of example in FIG. 10 and will be described in more detail below.

A method for producing the reflective optical element 10 will be described in the following text with reference to FIGS. 2 to 7.

Figure 2:
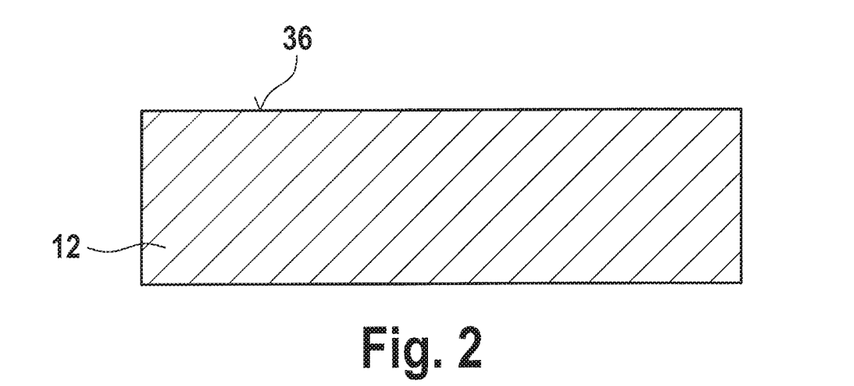
FIG. 2 shows an initial step in a method for producing the reflective optical element in FIG. 1.

In an initial method step, the substrate 12 is provided in a raw state. In this case, the substrate 12 can consist of an electrically conductive material, as goes for the abovementioned substrate materials, although this is not absolutely necessary for the method. The substrate 12 can also consist of a non-electrically conductive material.

In FIG. 2, the first surface 36 of the substrate 12 is planar. If the reflective optical element to be produced is intended to have, deviating from a planar configuration, a curved, for example concave optically effective surface 20, as in the case of the reflective optical element 10 in FIG. 1, or a convex optically effective surface 20, in a method step according to FIG. 3, first of all the first surface 36 of the substrate 12 is formed into a surface shape which corresponds to the basic shape of the optically effective surface 20 to be achieved. In the present exemplary embodiment, the first surface 36 of the substrate 12 is correspondingly preformed in a concave manner. The preforming of the first surface 36 can in this case take place in particular by machining.

Figure 3:
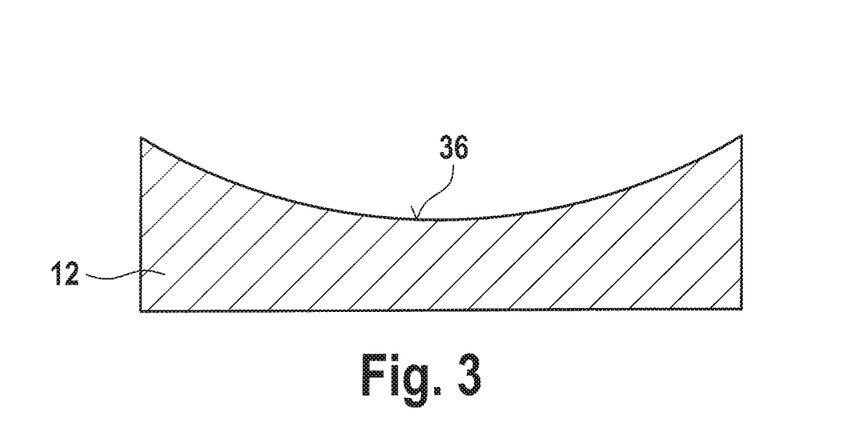
FIG. 3 shows a further step in the method for producing the reflective optical element in FIG. 1.
Figure 4:
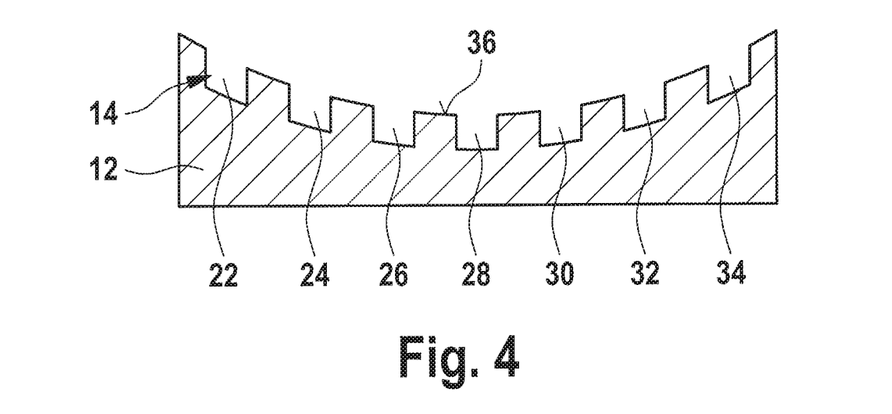
FIG. 4 shows yet a further step in the method for producing the reflective optical element in FIG. 1.

In a method step according to FIG. 4, the at least one cavity 14, in this case the channels 22 to 34, are introduced into the substrate 12, into the surface 36 preformed as per FIG. 3, from the first surface 36. The introduction of the channels 22 to 34, too, can take place by machining, in particular via milling, turning, drilling, erosion and/or laser ablation.

Figure 5:
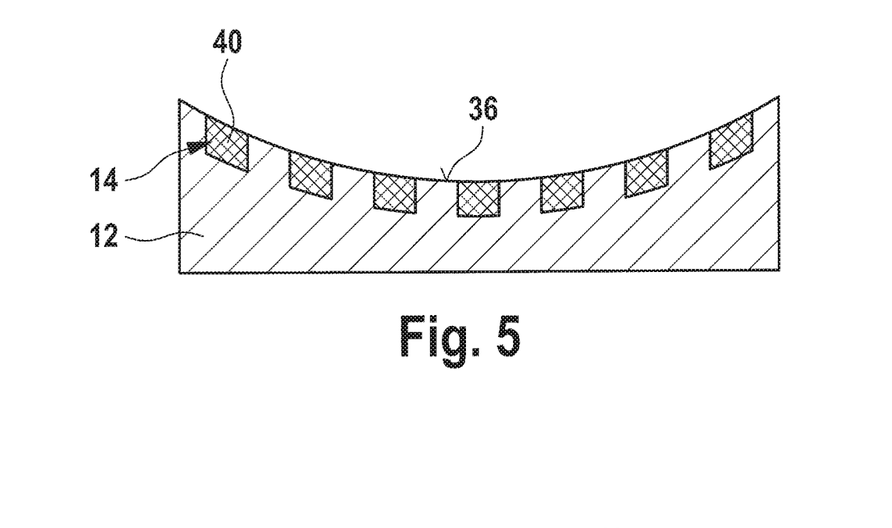
FIG. 5 shows yet a further step in the method for producing the reflective optical element in FIG. 1.

In a further step according to FIG. 5, the at least one cavity 14 is, or in this case the channels 22 to 34 are, filled with a material 40. The material 40 is a material that is able to be liquefied by application of heat and/or a material that is soluble in a solvent, in particular a wax, a polymer or a salt. The material 40 can be filled into the at least one cavity 14 particularly easily when it has been liquefied before filling and subsequently solidifies.

The material 40 is furthermore preferably electrically conductive, as can be achieved by admixture of graphite when wax is used. In the case of a polymer, too, the polymer can be rendered electrically conductive by admixture of electrically conductive particles, if the polymer is not itself electrically conductive.

Optionally, after the at least one cavity 14 has been filled with the material 40, the first surface 36 can be reworked, for example by machining via turning or milling, etc. In a further method step according to FIG. 6, the substrate 12 is now overcoated. If the substrate 12 and the material 40 with which the at least one cavity 14 is filled are electrically conductive, the overcoating can take place by deposition of one or more galvanic layers directly onto the surface 36. It goes without saying that the material(s) for the overcoating are also electrically conductive.

Figure 6:
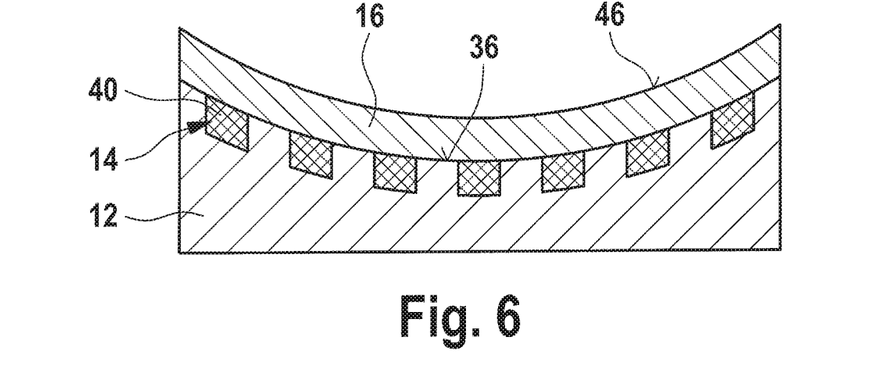
FIG. 6 shows yet a further step in the method for producing the reflective optical element in FIG. 1.

If the substrate 12 and/or the material 40 with which the at least one cavity 14 is filled is or are not electrically conductive, an electrically conductive layer (not shown) can first of all be applied to the first surface 36 of the substrate 12 when the overcoating is intended to take place galvanically.

If the overcoating is intended to take place by chemical deposition of one or more layers, it is not necessary for the substrate 12 or for the material 40 to be electrically conductive, and a possible electrical layer is not required on the first surface 36 of the substrate 12, either.

Materials which can be deposited galvanically at a comparatively high rate are preferably copper or galvanic nickel. Materials which are suitable for chemical deposition are chemical nickel (NIP), i.e. a nickel-phosphorus compound.

The overcoating of the first surface 36 of the substrate 12 takes place in this case also over the at least one cavity 14, in this case the channels 22 to 34. The material 40 in the at least one cavity 14 in this case prevents material of the overcoating 16 passing into the at least one cavity 14. The cavity 14 in the finished optical element 10 is thus free of material of the overcoating 16. The overcoating can take place in a one-stage or multistage process, i.e. it is possible for one or more layers to galvanically or chemically deposited.

Figure 8:
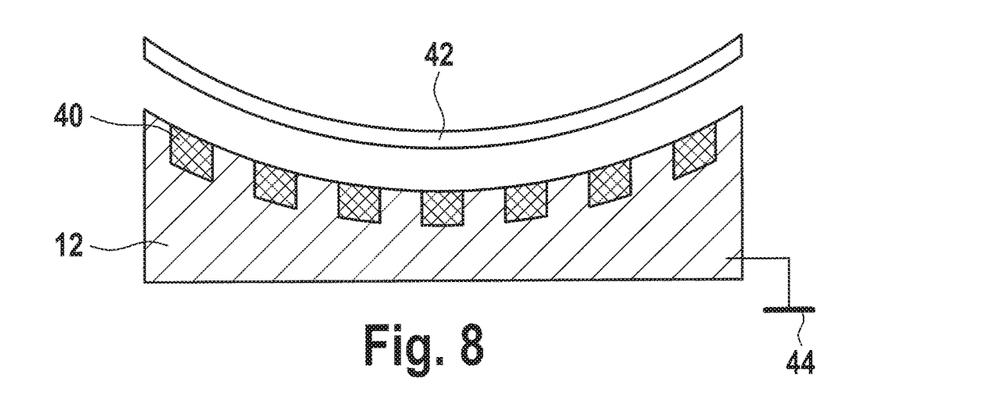
FIG. 8 shows a detail of the method step in FIG. 6.

According to FIG. 6, the overcoating 16 is deposited with a uniform thickness over the substrate 12. In the case of galvanic deposition of the overcoating 16, FIG. 8 shows, in this regard, an electrode arrangement made up of an electrode 42 and a counter electrode 44, wherein the latter is formed by the substrate 12 itself, with which the overcoating with a uniform thickness can be realized.

In the case of overcoating by galvanic deposition of copper on the substrate 12, the overcoating can take place at a high rate of growth, even when the overcoating 16 is deposited to a thickness of several millimeters.

In the overcoating according to FIG. 6, the roughly preformed basic shape of the first surface 36 of the substrate 12 is substantially retained, i.e. a surface 46 of the overcoating 16 has substantially the basic shape of the surface 36 of the substrate 12, at least when the overcoating 16 has an at least substantially uniform thickness over the substrate 12.

During overcoating of the substrate 12, the material which is deposited on the surface 36 of the substrate 12 can be varied continuously or incrementally. For example, when the material which is deposited on the substrate 12 is an alloy, it is possible for the composition of the alloy to be varied continuously or incrementally for example during the deposition of the material.

Figure 7:
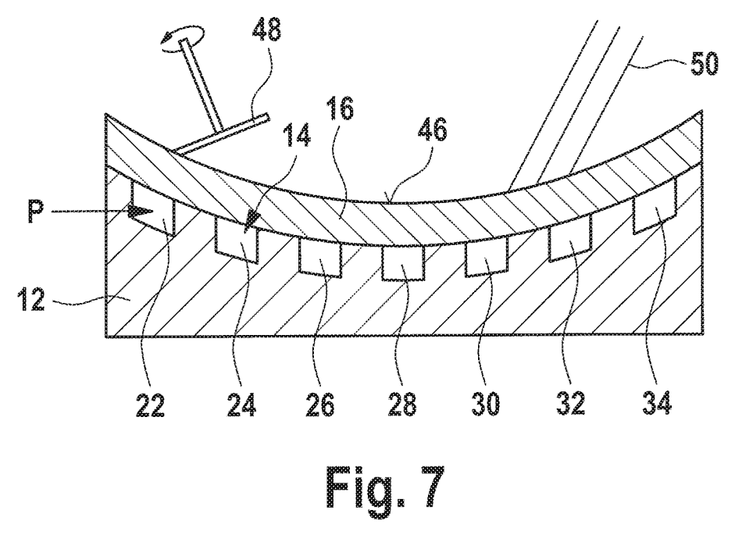
FIG. 7 shows yet a further step in the method for producing the reflective optical element in FIG. 1.

In a further method step according to FIG. 7, the surface 46 of the overcoating 16 is fine-machined in accordance with the final shape of the optically effective surface 20 that is to be achieved. The fine machining is carried out subtractively, for example via a cutting tool 48, for example a diamond milling cutter.

If the overcoating 16 is constructed from several galvanically or chemically deposited layers, at least the layer applied last should consist of a readily cuttable material which is accessible for ultraprecise machining.

During the fine machining of the surface 46 of the overcoating 16, the latter is also finely formed, for example aspherized or provided with a free form.

The fine-machined surface 46 is furthermore also smoothed, in particular polished, if desired.

The shape of the surface 46 of the overcoating 16 can subsequently also be corrected, in particular via ion beam forming, as is illustrated by ion beams 50 indicated by lines.

Before or after the fine machining of the surface 46 of the overcoating 16, the material 40 is emptied out of the at least one cavity 14, in this case the channels 22 to 34. In the case of a material 40 that is able to be liquefied by application of heat, the substrate 12 is correspondingly heated, for example, and in the case of a material 40 that is soluble in a solvent, a solvent is passed into the channels 22 to 34.

A further measure which can be taken during the fine machining of the surface 46 of the overcoating 16 is that of putting the at least one cavity 14, in this case at least individual channels 22 to 34 or all of the channels 22 to 34, under a pressure P with a fluid, with the result that the surface 46 has an outward bulge in the region of the channels 22 to 34, depending on which of the channels has been put under pressure, the bulge being correspondingly removed in each case during fine machining. Thus, a surface deformation error or shape accuracy error of the optically effective surface 20 during operation of the reflective optical element 10 in which the channels 22 to 34 have likewise been put under pressure, and/or when the reflective optical element is operated under vacuum, is prevented.

When the surface 46 of the overcoating 16 has been fully machined, the reflective layer 18 is applied to the surface 46 of the overcoating 16, such that the reflective optical element 10 according to FIG. 1 is produced.

The at least one reflective layer 18 is for example a stack of molybdenum and silicon (MoSi) layers.

Figure 9:
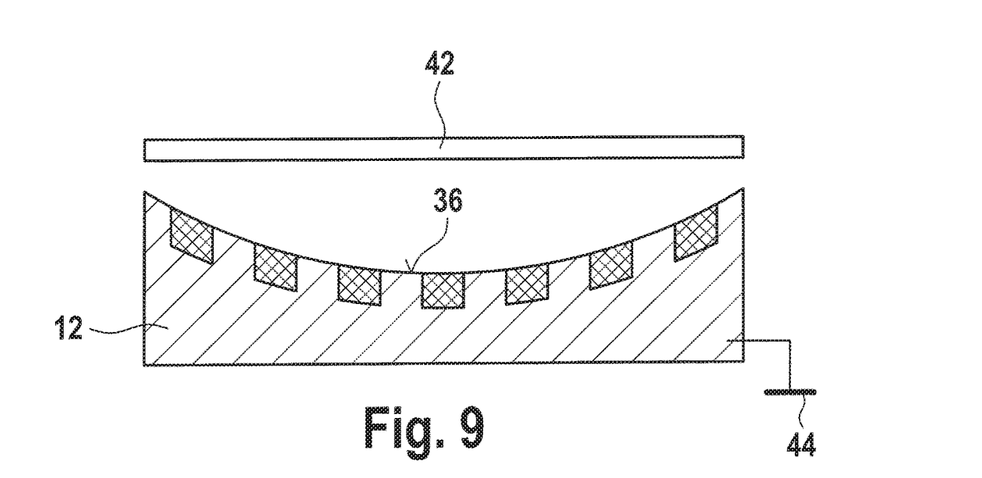
FIG. 9 shows a modification of the method step in FIG. 8.
Figure 10:
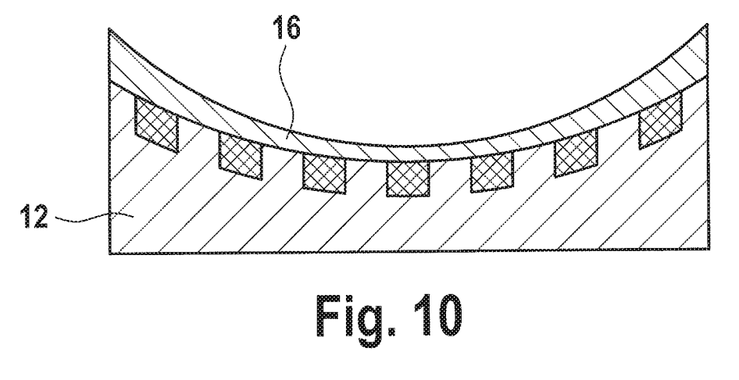
FIG. 10 shows a result of the method step in FIG. 9.

FIG. 9 shows a modification of the configuration of the method according to FIG. 8, according to which the overcoating 16 is applied to the substrate 12 with a nonuniform thickness over the substrate 12, as is shown by way of example in FIG. 10. For this purpose, FIG. 9 shows an electrode arrangement in which the electrode 42 is flat such that the electrode is at a variable distance from the surface 36 of the substrate as seen over the substrate 12. As a result of the greater distance of the electrode 42 from the surface 36 in the middle of the substrate 12, the overcoating 16 is applied there with a smaller thickness than at the edges of the substrate 12, at which the electrode 42 is at a correspondingly smaller distance from the surface 36 of the substrate 12.

In order to achieve other thickness profiles of the overcoating 16 than the one shown in FIG. 10, the geometry of the electrode 42 or the distance positioning of several electrodes can be selected accordingly, in order to apply the overcoating 16 to the substrate 12 with a desired thickness profile, for example an undulating thickness profile.

FIGS. 11 to 15 show various exemplary geometries for the at least one cavity 14, wherein FIGS. 11 to 14 show plan views of the substrate 12 following the introduction of the at least one cavity 14.

Figure 11:
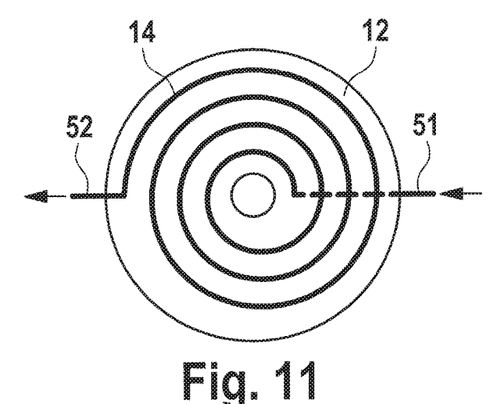
FIGS. 11 to 15 show different geometries of one or more cavities with which the reflective optical element in FIG. 1 can be configured, in a plan view of the substrate of the element without overcoating.

FIG. 11 shows a continuous spiral cavity 14 with an inlet 51 for letting in fluid and an outlet 52 for letting the fluid out of the cavity 14. The circulation of the fluid in this case takes place in a spiral shape from the center toward the edge of the substrate 12.

Figure 12:
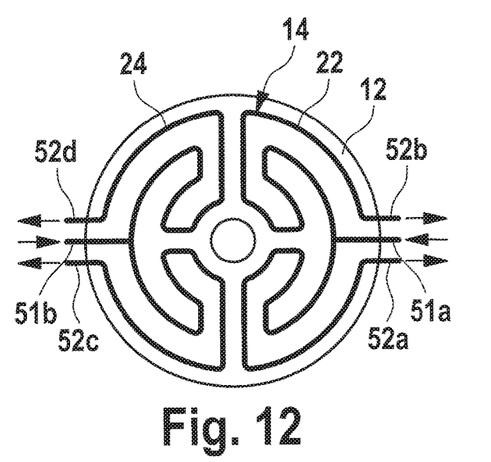

FIG. 12 shows a geometry of cavities 14 which are formed in this exemplary embodiment from two channels 22 and 24 which do not communicate with one another. The channel 22 has an inlet 21a and two outlets 52a and 52b, and the channel 24 has an inlet 51b and two outlets 52c and 52d.

Figure 13:
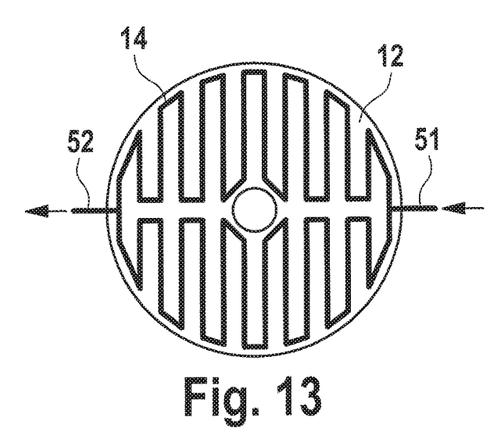

FIG. 13 shows a geometry of an individual continuous cavity 14 which extends over the substrate 12 in a meandering manner from the inlet 51 to the outlet 52.

Figure 14:
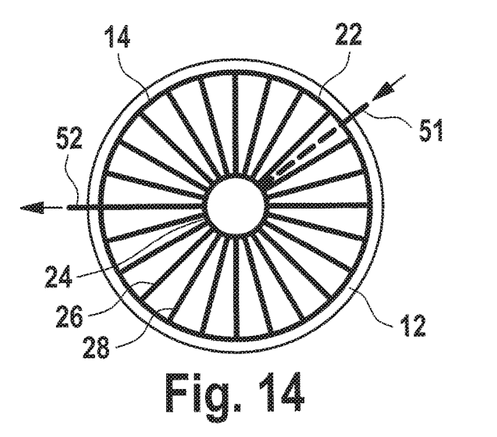

FIG. 14 shows a cavity 14 which has a circular channel 22 radially on the outside, a circular channel 24 at the center and a multiplicity of radial channels 26, 28, etc. which connect the channels 22 and 24 together. From the inlet 51, the fluid first of all passes into the radially inner channel 24 and via the spoke-like radial channels 26, 28 etc. into the outer channel 14, and from there into the outlet 52.

Figure 15:
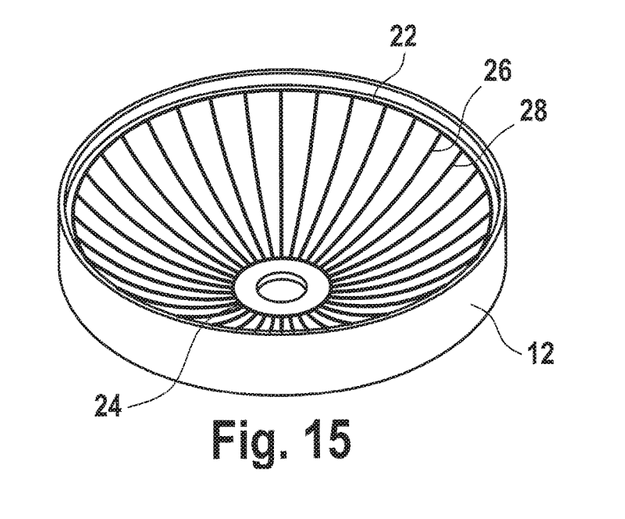

FIG. 15 shows a perspective view of the substrate 12 with the channels according to FIG. 14.

Figure 16:
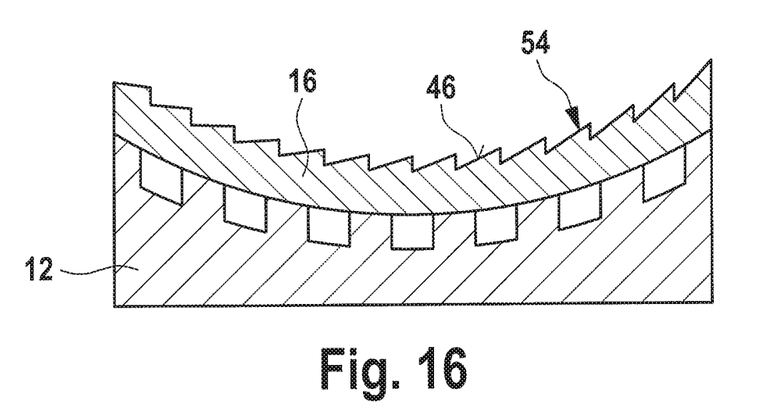
FIG. 16 shows an exemplary embodiment of a result of the method step in FIG. 7.

FIG. 16 shows a further configuration of the method for producing the reflective optical element 10 in FIG. 1, in which, during the fine machining of the surface 46 of the overcoating 16 according to FIG. 7, an optically effective structure 54 is worked into the surface 46 of the overcoating 16, in particular by machining. The optically effective structure 54 is a diffraction grating for example in this case. When the reflective layer 18 is applied, the optically effective structure 54 is maintained, i.e. the optically effective structure 54 is transferred substantially precisely to a corresponding optically effective structure of the optically effective surface 20.

In further modifications of the reflective optical element 10 and of the method for producing same, the at least one cavity 14, for example channels 22 to 34, can be introduced into the substrate 12 such that the channels 22 to 34 narrow toward the surface 36 of the substrate 12. This makes it possible to carry out the overcoating 16 with a smaller thickness, since, when the channels 22 to 34 are subjected to pressure, on account of the narrowing shape of the channels 22 to 34 there is less of a tendency for the optically effective surface 20 to bulge.

Figure 17:
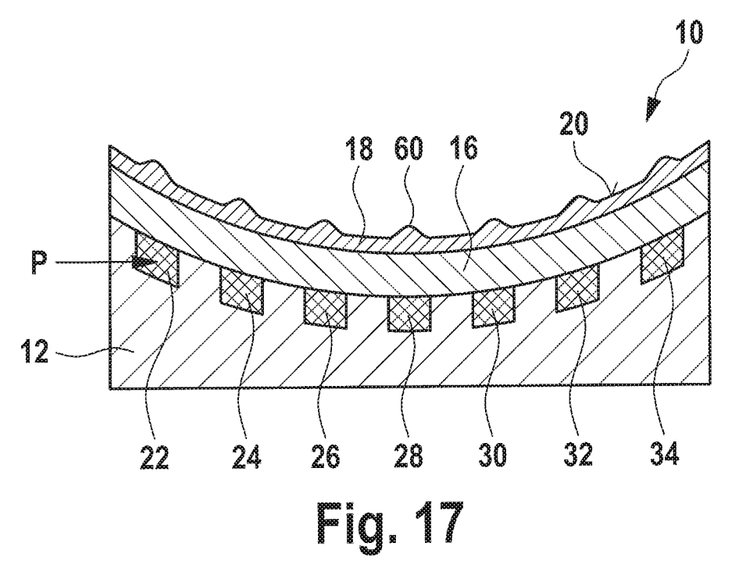
FIG. 17 shows an exemplary embodiment according to which the reflective optical element in FIG. 1 is used as a manipulator/compensator.

On the other hand, the bulging of the optically effective surface 20 can also be desired, specifically when the reflective optical element 10 is used as an optical manipulator, as shown in FIG. 17. In this case, the channels 22 to 34 are individually or jointly subjected to a positive pressure P in a targeted manner, wherein provision can also be made for each of the channels 22 to 34 to be able to be subjected to a different pressure P. As a result, a desired surface deformation of the optically effective surface 20 can be set and changed in a targeted manner, as is illustrated in FIG. 17 with individual wave peaks 60. This can serve to influence, in a targeted manner, the wavefront of the optical system in which the element 10 is used. It is also conceivable for the channels 22 to 34 to be subjected to a negative pressure, with the result that wave troughs can also be set in the optically effective surface 20, and it is also possible for individual channels to be subjected to a positive pressure and others to a negative pressure.

The use of the reflective optical element 10 as a manipulator for influencing an optical wavefront is possible particularly in that the cavities, or channels 22 to 34, are arranged close to the surface 20 of the element 10, and in that the overcoating 16 can be embodied in a thin manner.

The optical element 10 can also be used as a compensator, wherein, in this case, the cavities, or channels 22 to 34, are subjected to a variable pressure in order to compensate for undesired deformation of the optically effective surface 20.

The reflective optical element 10 can be a macroscopic mirror or a miniaturized mirror element of a one-dimensional or two-dimensional mirror array. Furthermore, the reflective optical element 10 can also be configured as a mixing element in a honeycomb or cylinder honeycomb embodiment.

Finally, the reflective optical element 10 can also be configured simply as a thin membrane, optionally with an associated sensor system or actuator system on that side of the substrate 12 that faces away from the optically effective surface 20.

Figure 18:
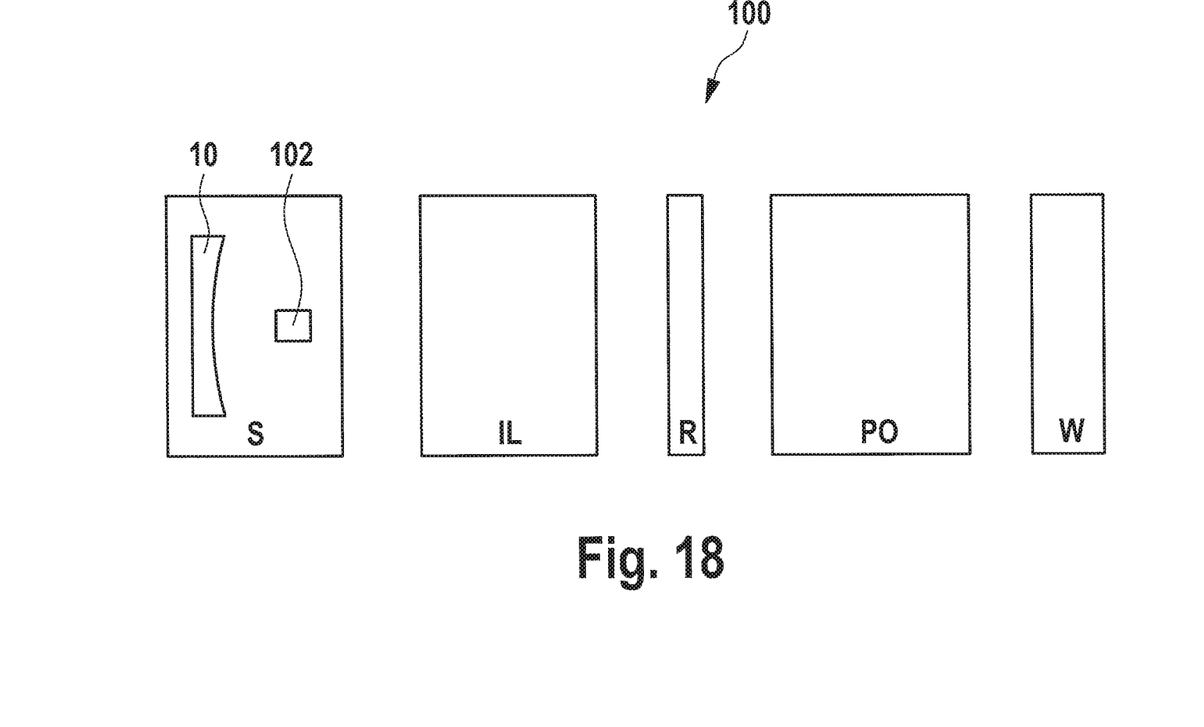
FIG. 18 shows an exemplary embodiment of an optical system in which the reflective optical element in FIG. 1 is used.

FIG. 18 shows a use of the reflective optical element 10 in an optical system 100 for EUV applications.

In this case of the use of the reflective optical element 10, it is used as a collector mirror of an EUV light source S, wherein the EUV radiation is generated by a target 102. The optical system 100 is in particular a microlithographic projection exposure apparatus and has, downstream of the light source S, an illumination system IL, a reticle R, a projection lens PO and a wafer W.

Further uses of the reflective optical element 10 in optical systems for material processing with high-intensity light, for example for boring, ablation, melting via laser light.

What is claimed is:

1. An optical element, comprising:
   a substrate;
   an overcoating comprising a galvanically or chemically deposited layer on a first surface of the substrate;
   a cavity configured to receive a fluid; and
   a reflective layer comprising an optically effective surface,
   wherein:
      the cavity is near the first surface of the substrate;
      the overcoating extends over the cavity;
      the cavity is free of material of the overcoating; and
      the reflective layer is on a surface of the overcoating that faces away from the substrate.

2. The optical element of claim 1, wherein the cavity comprises at least one channel.

3. The optical element of claim 1, wherein cavity comprises a plurality of channels, and the channels have a width which is in the range from a few micrometers to around one millimeter.

4. The optical element of claim 1, wherein the cavity comprises an opening that leads into the optically effective surface of the reflective layer.

5. The optical element of claim 1, wherein the substrate comprises steel, a copper alloy and/or aluminum-silicon.

6. The optical element of claim 1, wherein the overcoating comprises copper, nickel and/or nickel with phosphorus.

7. The optical element of claim 1, wherein the materials of the substrate and of the overcoating have an at least approximately identical coefficient of thermal expansion.

8. The optical element of claim 1, wherein the material(s) of the overcoating have a coefficient of thermal expansion which is greater than a coefficient of thermal expansion of the material(s) of the substrate.

9. The optical element of claim 1, wherein the overcoating has a uniform thickness, or wherein the overcoating has a thickness that varies over the first surface of the substrate.

10. An optical system, comprising:
    a mirror comprising the optical element of claim 1,
    wherein the optical system is configured to be used in the VUV, EUV or even shorter-wave spectral range or for material processing with high-intensity light.

11. A system, comprising:
    a collector mirror comprising the optical element of claim 1,
    wherein the system is an EUV microlithography system.

12. A system, comprising:
    an article comprising the optical element of claim 1,
    wherein the article comprises an optical compensator and/or manipulator, and the cavity is subjectable to variable pressure to compensate for an undesired deformation of the optically effective surface to produce a desired deformation in the optically effective surface.

13. The optical element of claim 6, wherein the substrate comprises steel, a copper alloy and/or aluminum-silicon.

14. The optical element of claim 6, wherein the substrate comprises an aluminum-silicon comprising up to 35% silicon.

15. The optical element of claim 14, wherein the optical element comprises a mirror.

16. The optical element of claim 1, wherein the substrate comprises steel, a copper alloy and/or aluminum-silicon.

17. The optical element of claim 16, wherein the optical element comprises a mirror.

18. The optical element of claim 1, wherein the substrate comprises an aluminum-silicon comprising up to 35% silicon.

19. The optical element of claim 18, wherein the optical element comprises a mirror.

20. The optical element of claim 1, wherein a difference between a coefficient of thermal expansion of the substrate and a coefficient of thermal expansion of the overcoating is less than 10 ppm/K.

* * * * *

UNITED STATES PATENT AND TRADEMARK OFFICE
CERTIFICATE OF CORRECTION

PATENT NO. : 11,372,334 B2
APPLICATION NO. : 16/686600
DATED : June 28, 2022
INVENTOR(S) : Markus Bauer, Ulrich Bingel and Willi Anderl It is certified that error appears in the above-identified patent and that said Letters Patent is hereby corrected as shown below:

In the Specification

Column 1, Line 62, delete "galvanicly" insert -- galvanically --.

Column 1, Line 63, delete "galvanicly" insert -- galvanically --.

Column 5, Line 51, delete "galvanicly" insert -- galvanically --.

Column 10, Line 52, delete "(NIP)," insert -- (NiP), --.

Signed and Sealed this
Twenty-third Day of August, 2022

*Katherine Kelly Vidal*

Katherine Kelly Vidal
*Director of the United States Patent and Trademark Office*